(12) United States Patent
Karmaker

(10) Patent No.: US 9,385,672 B2
(45) Date of Patent: Jul. 5, 2016

(54) COMPENSATED COMMON-MODE FEEDBACK FOR AN AMPLIFIER

(71) Applicant: QUALCOMM Incorporated, San Diego, CA (US)

(72) Inventor: Rahul Karmaker, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/553,688

(22) Filed: Nov. 25, 2014

(65) Prior Publication Data

US 2016/0149546 A1     May 26, 2016

(51) Int. Cl.
*H03F 3/45*     (2006.01)
*H03F 1/22*     (2006.01)

(52) U.S. Cl.
CPC ............ *H03F 3/45645* (2013.01); *H03F 1/223* (2013.01); *H03F 2203/45051* (2013.01); *H03F 2203/45062* (2013.01); *H03F 2203/45066* (2013.01); *H03F 2203/45116* (2013.01); *H03F 2203/45151* (2013.01); *H03F 2203/45156* (2013.01)

(58) Field of Classification Search
CPC ......................... H03F 3/45; H03F 220/451223
USPC .......................................... 330/253, 258, 292
See application file for complete search history.

(56) References Cited

U.S. PATENT DOCUMENTS

| | | | |
|---|---|---|---|
| 6,259,313 B1 * | 7/2001 | Lewicki | G06G 7/1865 327/554 |
| 6,366,170 B1 * | 4/2002 | Maida | H03F 3/45147 330/267 |
| 6,377,121 B1 | 4/2002 | Giduturi | |
| 6,933,785 B2 | 8/2005 | Wedel | |
| 7,289,149 B1 | 10/2007 | Lee et al. | |
| 7,560,987 B1 * | 7/2009 | Cetin | H03F 3/45291 330/258 |
| 7,619,473 B2 | 11/2009 | Tanimoto et al. | |
| 7,671,676 B2 | 3/2010 | Singh et al. | |
| 8,319,554 B1 | 11/2012 | Das | |
| 2012/0293261 A1 | 11/2012 | Das | |
| 2015/0200635 A1 * | 7/2015 | Wang | H03F 3/45228 330/258 |

FOREIGN PATENT DOCUMENTS

GB     2488307 A     8/2012

OTHER PUBLICATIONS

Centurelli F., et al., "An Improved Common-mode Feedback Loop for the Differential-difference Amplifier," Analog Integrated Circuits and Signal Processing, Kluwer Academic Publishers, Bo, vol. 74, No. 1, Sep. 25, 2012, pp. 33-48, XP035154522, ISSN: 1573-1979, DOI: 10.1007/S10470-012-9961-1 p. 33, left-hand column, line 20—p. 46, right-hand column, line 15; figures 1,2,8,10.

International Search Report and Written Opinion—PCT/US2015/060473—ISA/EPO—Feb. 17, 2016.

* cited by examiner

*Primary Examiner* — Steven J Mottola
(74) *Attorney, Agent, or Firm* — Paradice and Li LLP

(57) ABSTRACT

A common-mode feedback module is disclosed for controlling feedback in an amplifier, such as a multi-stage amplifier. The common-mode feedback module may include a feedback input stage, a cascode stage, and a feedback output stage. The common-mode feedback module may provide feedback, such as negative feedback to the amplifier to extend a bandwidth of a frequency response and/or increase stability.

20 Claims, 7 Drawing Sheets

COMPENSATED COMMON-MODE FEEDBACK FOR AN AMPLIFIER

TECHNICAL FIELD

The present embodiments relate generally to amplifiers, and specifically to providing compensated common-mode feedback to an amplifier.

BACKGROUND OF RELATED ART

A wireless device (e.g., a cellular phone or a smartphone) in a wireless communication system may transmit and receive data for two-way communication. The wireless device may include a transmitter for data transmission and a receiver for data reception. For data transmission, the transmitter may modulate a radio frequency (RF) carrier signal with data to generate a modulated RF signal, amplify the modulated RF signal to generate a transmit RF signal having the proper output power level, and then transmit the transmit RF signal via an antenna to a base station. For data reception, the receiver may obtain a received RF signal via the antenna and may amplify and process the received RF signal to recover data sent by the base station.

The wireless device may include one or more amplifiers to process analog signals. For example, amplifiers may provide a processing gain (e.g., voltage or current gain) for relatively low amplitude signals, isolation for relatively sensitive signals, increased current for driving signals into transmission lines, and signal amplification for transmitting signals through a communication medium.

Some amplifiers may provide more than adequate amounts of processing gain, but may also have some undesirable operating characteristics. For example, some amplifiers may be unstable at certain operating points (e.g., an output of the amplifier may oscillate or otherwise no longer correspond to an input of the amplifier at certain input/output levels). Amplifier instability may render the amplifier inoperable and/or unreliable.

Feedback techniques, such as negative feedback techniques, may be used to increase the stability of an amplifier design. While negative feedback techniques may increase stability, negative feedback may also adversely affect a frequency response and/or bandwidth of the amplifier.

Thus, there is a need to improve amplifier stability while reducing and/or limiting a negative impact on frequency response and/or bandwidth.

BRIEF DESCRIPTION OF THE DRAWINGS

The present embodiments are illustrated by way of example and are not intended to be limited by the figures of the accompanying drawings. Like numbers reference like elements throughout the drawings and specification.

DETAILED DESCRIPTION

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature and/or details are set forth to provide a thorough understanding of the present embodiments. However, it will be apparent to one skilled in the art that these specific details may not be required to practice the present embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The present embodiments are not to be construed as limited to specific examples described herein but rather to include within their scope all embodiments defined by the appended claims.

In addition, the detailed description set forth below in connection with the appended drawings is intended as a description of exemplary embodiments of the present disclosure and is not intended to represent the only embodiments in which the present disclosure may be practiced. The term "exemplary" used throughout this description means "serving as an example, instance, or illustration," and should not necessarily be construed as preferred or advantageous over other embodiments.

Figure 1:
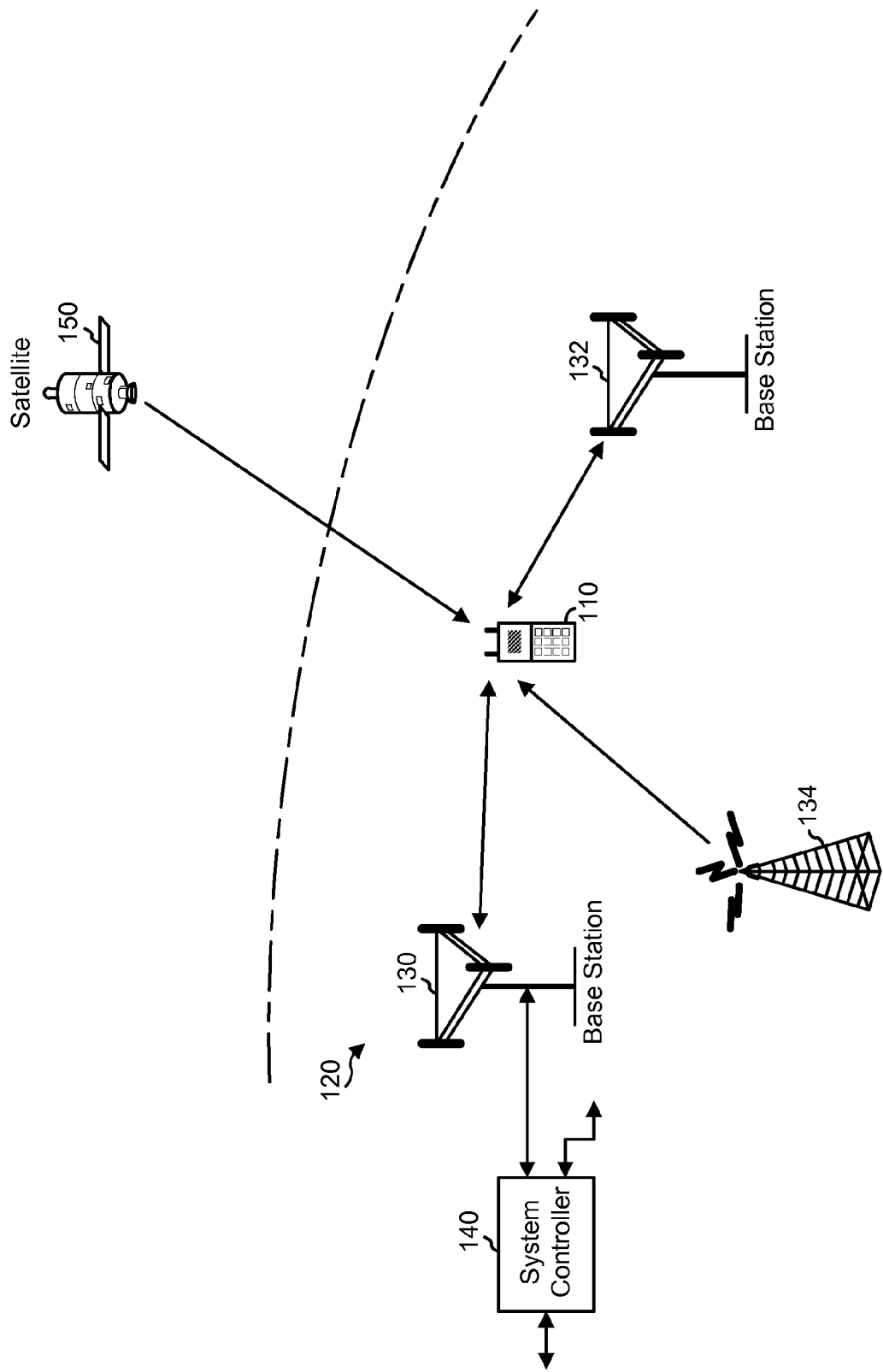
FIG. 1 shows a wireless device communicating with a wireless communication system, in accordance with some exemplary embodiments.

FIG. 1 shows a wireless device 110 communicating with a wireless communication system 120 in accordance with some exemplary embodiments. Wireless communication system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless system may include any number of base stations and any set of network entities.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless communication system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1×, EVDO, TD-SCDMA, GSM, 802.11, etc.

Figure 2:
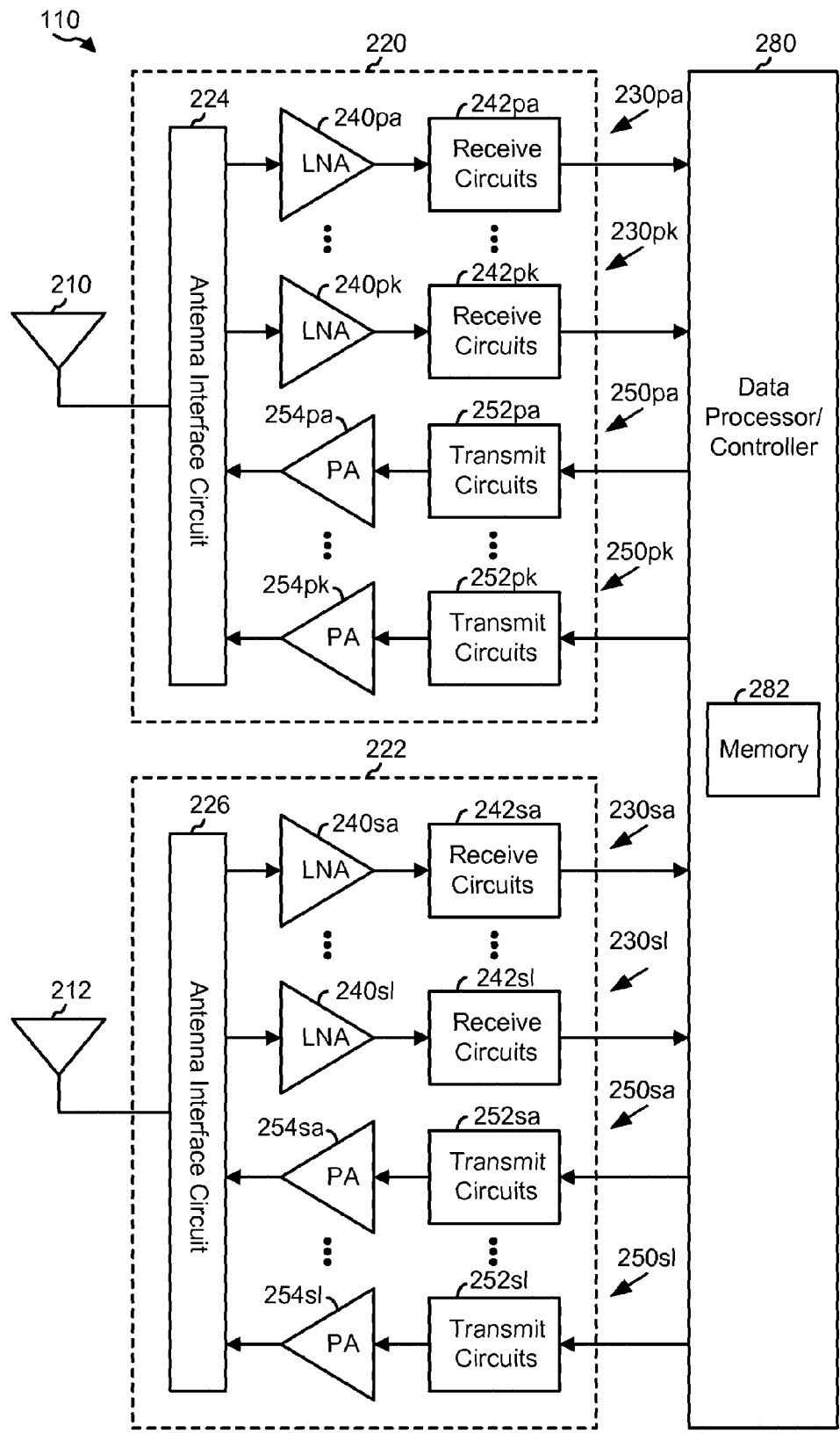
FIG. 2 shows a block diagram of an exemplary design of the wireless device in FIG. 1

FIG. 2 shows a block diagram of an exemplary design of wireless device 110 in FIG. 1. In this exemplary design, wireless device 110 includes a primary transceiver 220 coupled to a primary antenna 210, a secondary transceiver 222 coupled to a secondary antenna 212 and a data processor/controller 280. Primary transceiver 220 includes a number (K) of receivers 230sa to 230pk and a number (K) of transmitters 250pa to 250pk support multiple frequency bands, multiple radio technologies, carrier aggregation, etc. Secondary transceiver 222 includes a number (L) of receivers 230sa to 230sl and a number (L) of transmitters 250sa to 250sl to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, each receiver 230 includes a low noise amplifier (LNA) 240 and receive circuits 242. For data reception, primary antenna 210 receives signals from base stations and/or other transmitter stations and provides a received radio frequency (RF) signal, which is routed through an antenna interface circuit 224 and presented as an input RF signal to a selected receiver. Antenna interface circuit 224 may include switches, duplexers, transmit filters, receive filters, matching circuits, etc. The description below assumes that receiver 230pa is the selected receiver. Within receiver 230pa, an LNA 240pa amplifies the input RF signal and provides an output RF signal. Receive circuits 242pa downconvert the output RF signal from RF to baseband, amplify and filter the downconverted signal, and provide an analog input signal to data processor/controller 280. Receive circuits 242pa may include mixers, filters, amplifiers, matching circuits, an oscillator, a local oscillator (LO) generator, a phase locked loop (PLL), etc. Each remaining receiver 230 in transceivers 220 and 222 may operate in similar manner as receiver 230pa.

In the exemplary design shown in FIG. 2, each transmitter 250 includes transmit circuits 252 and a power amplifier (PA) 254. For data transmission, data processor/controller 280 processes (e.g., encodes and modulates) data to be transmitted and provides an analog output signal to a selected transmitter. The description below assumes that transmitter 250pa is the selected transmitter. Within transmitter 250pa transmit circuits 252pa amplify, filter, and upconvert the analog output signal from baseband to RF and provide a modulated RF signal. Transmit circuits 252pa may include amplifiers, filters, mixers, matching circuits, an oscillator, an LO generator, a PLL, etc. A PA 254pa receives and amplifies the modulated RF signal and provides a transmit RF signal having the proper output power level. The transmit RF signal is routed through antenna interface circuit 224 and transmitted via primary antenna 210. Each remaining transmitter 250 in transceivers 220 and 222 may operate in similar manner as transmitter 250pa.

FIG. 2 shows an exemplary design of receiver 230 and transmitter 250. A receiver and a transmitter may also include other circuits not shown in FIG. 2, such as filters, matching circuits, etc. All or a portion of transceivers 220 and 222 may be implemented on one or more analog integrated circuits (ICs), RF ICs (RFICs), mixed-signal ICs, etc. For example, LNAs 240 and receive circuits 242 within transceivers 220 and 222 may be implemented on multiple IC chips, as described below. The circuits in transceivers 220 and 222 may also be implemented in other manners.

Data processor/controller 280 may perform various functions for wireless device 110. For example, data processor/controller 280 may perform processing for data being received via receivers 230 and data being transmitted via transmitters 250. Data processor/controller 280 may control the operation of the various circuits within transceivers 220 and 222. A memory 282 may store program codes and data for data processor/controller 280. Data processor/controller 280 may be implemented on one or more application specific integrated circuits (ASICs) and/or other ICs.

Figure 3:
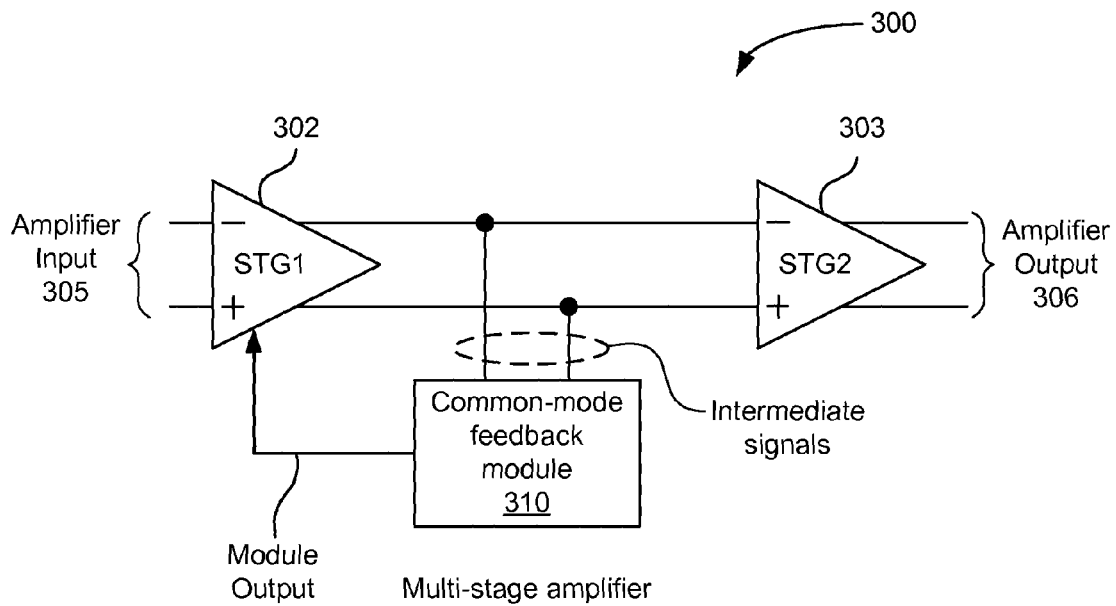
FIG. 3 depicts an exemplary embodiment of an amplifier.

FIG. 3 depicts an exemplary embodiment of an amplifier 300. In some embodiments, amplifier 300 may be included within receive circuits 242 and/or transmit circuits 252 as described above. In some embodiments, amplifier 300 may be a multi-stage amplifier. As shown, amplifier 300 includes a common-mode feedback module 310, a first stage 302 and a second stage 303. In other embodiments, amplifier 300 may include any number of stages. Amplifier 300 may receive amplifier input signals 305 and may generate amplifier output signals 306. As shown, amplifier 300 may be a differential amplifier (e.g., an amplifier that generates amplifier output signals 306 based on a voltage and/or current difference determined between input nodes). In other embodiments, amplifier 300 may be a single ended amplifier where first stage 302 has a single input node instead of two nodes (not shown for simplicity).

Common-mode feedback module 310 may receive one or more intermediate signals, process the intermediate signals, and return the processed intermediate signals to amplifier 300 as an additional input signal. In some embodiments, common-mode feedback module 310 may receive intermediate signals from one or more inter-stage signals. For example, intermediate signals between first stage 302 and second stage 303 may function as input signals for common-mode feedback module 310. As shown, output signals of common-mode feedback module 310 may be provided to first stage 302. In other embodiments, output signals may be provided to second stage 303 (not shown for simplicity).

Figure 4:
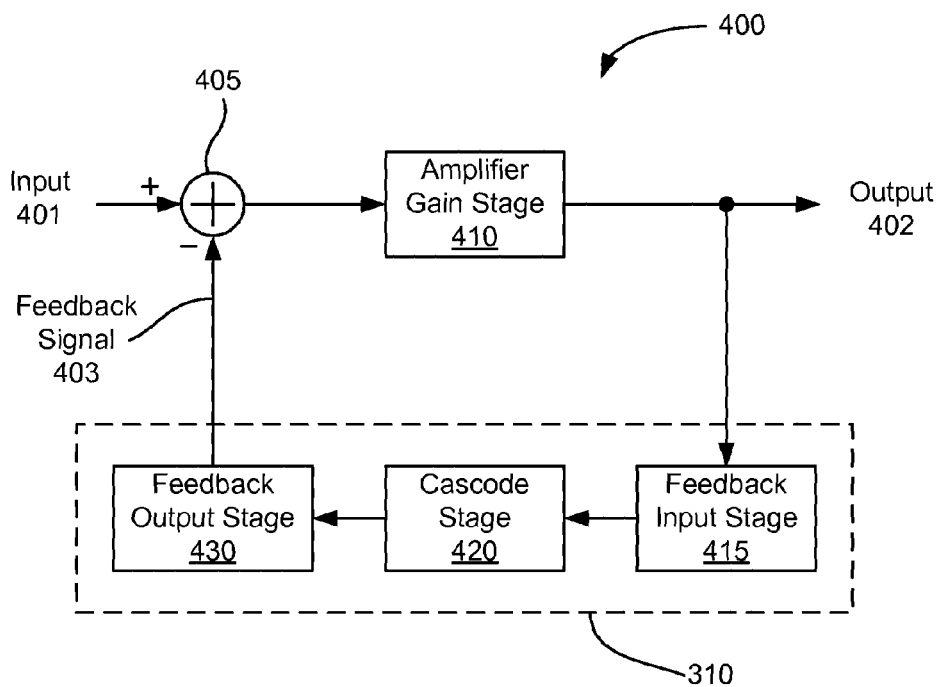
FIG. 4 shows a block diagram of an exemplary embodiment of an amplifier gain stage including a common-mode feedback module.

FIG. 4 shows a block diagram 400 of an exemplary embodiment of an amplifier gain stage 410 including the common-mode feedback module 310. The common-mode feedback module 310 may include a feedback input stage 415, a cascode stage 420, and a feedback output stage 430. As described above, common-mode feedback module 310 may receive a signal from amplifier 300 process the received signal and return the processed signal as another input signal for amplifier 300. Thus, in some embodiments, common-mode feedback module 310 may be coupled to first stage 302 or second stage 303. In other embodiments, common-mode feedback module 310 may interact with any number of stages or groups of stages associated with amplifier 300.

Amplifier gain stage 410 may receive an input signal 401 through a summer (e.g., a summing node) 405. Amplifier gain stage 410 may amplify input signal 401 (as provided by summer 405), and generate an output signal 402 based on amplified input signal 401. Common-mode feedback module 310 may receive output signal 402 as an input signal. Thus, output signal 402 may be coupled to feedback input stage 415. In some embodiments, feedback input stage 415 may accept differential or single-ended input signals.

An output of feedback input stage 415 may be coupled to an input of cascode stage 420. Cascode stage 420 may provide signal gain and/or signal isolation to signals provided by feedback input stage 415. In some embodiments, the combination of feedback input stage 415 and cascode stage 420 may determine one or more signal processing characteristics of common-mode feedback module 310. For example, a gain provided by feedback input stage 415 in combination with gain provided by cascode stage 420 may determine a gain and/or feedback characteristic for common-mode feedback module 310.

An output of cascode stage 420 may be coupled to an input of feedback output stage 430. In one embodiment, feedback output stage 430 may provide one or more buffered outputs for common-mode feedback module 310. The buffered outputs may be a feedback signal 403 that may be subtracted from input signal 401 through summer 405. In some embodiments, signal flow from output signal 402 through common-mode feedback module 310 and subtracted by summer 405 may constitute all or a portion of a negative feedback loop.

Figure 5:
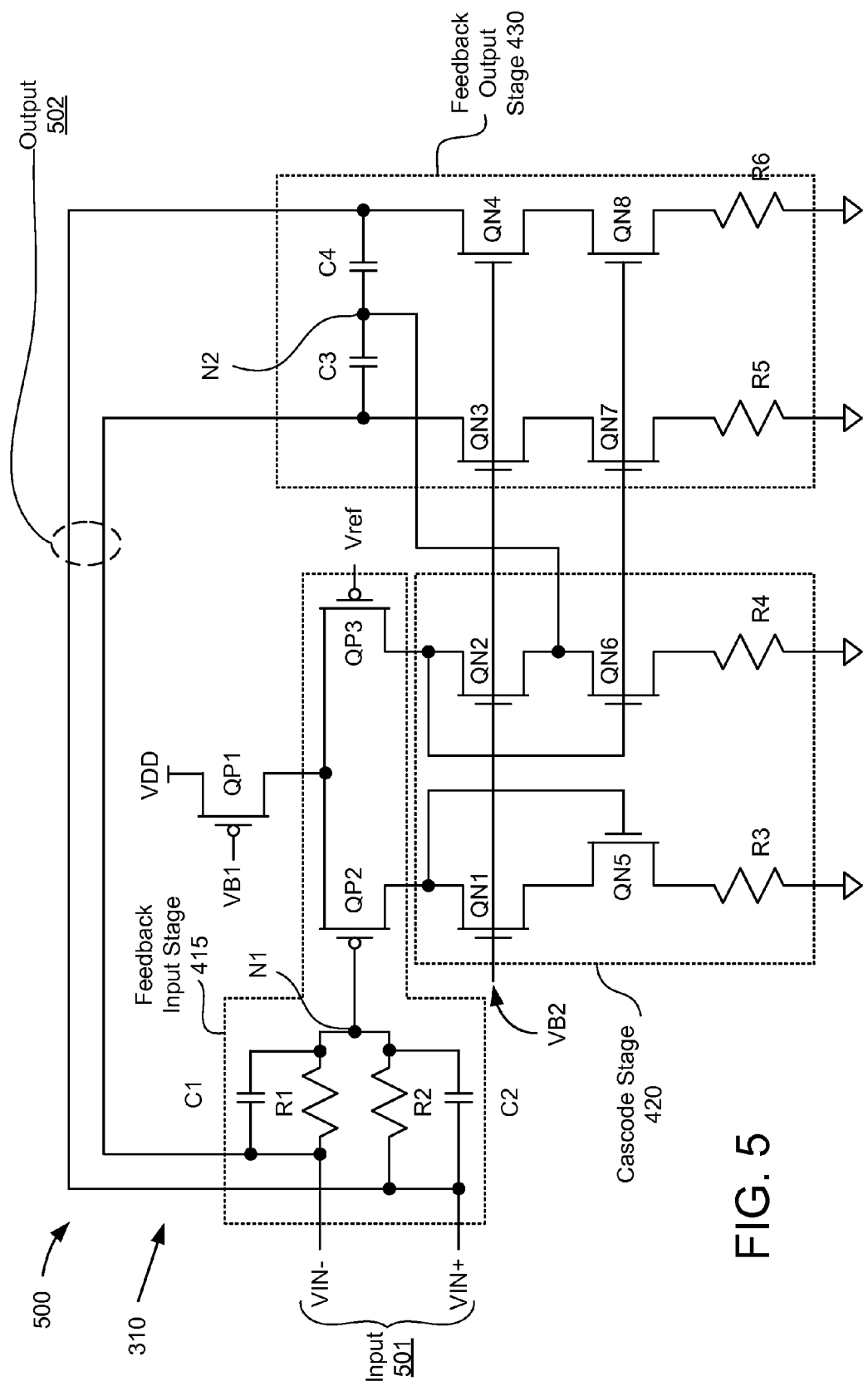
FIG. 5 is a circuit diagram of one embodiment of the common-mode feedback module.

FIG. 5 is a circuit diagram 500 of an exemplary embodiment of the common-mode feedback module 310. Common-mode feedback module 310 may include feedback input stage 415 cascode stage 420 and feedback output stage 430 as described above. Each stage 415, 420 and 430 is shown in FIG. 5 with dashed lines. In other embodiments, common-mode feedback module 310 may include other stages (not shown for simplicity).

In one embodiment, feedback input stage 415 may include a differential input stage, and may include p-channel (PMOS) MOSFETS QP2 and QP3 and resistors R1 and R2. In other embodiments, feedback input stage 415 may include different numbers of devices (e.g., MOSFETS) and/or other types of devices (e.g., n-channel MOSFETS (NMOS), n-type and p-type bipolar transistors, and the like). A feedback input signal 501 may include VIN− and VIN+ signals and may be coupled to resistors R1 and R2, respectively. In some embodiments, resistors R1 and R2 may be arranged into a resistor divider configuration. For example, a first terminal of R1 may be coupled to a first terminal of R2 to arrange R1 and R2 into a resistor divider configuration. In one embodiment, if R1 and R2 are similarly valued, then the resistor divider may determine an average voltage (with respect to VIN− and VIN+ signals). In one embodiment, feedback input stage 415 may provide an input stage output signal based on a difference between a voltage determined by the resistor divider (e.g., an average voltage) and a voltage reference Vref. Thus, a node N1 from the resistor divider may be coupled to a gate terminal of QP2, and Vref may be coupled to a gate terminal of QP3. In this manner, node N1 may perform as a common mode sense terminal. In some embodiments, a current source may be coupled to a source terminal of QP1 and QP2. For example, QP1 (biased by bias voltage VB1) may operate as a current source for QP2 and QP3.

In some embodiments, feedback input stage 415 may also include capacitors C1 and C2. In some cases, capacitors C1 and C2 may be selected to improve high frequency response (e.g., to allow common-mode feedback module 310 to provide a faster transient response). In one embodiment, capacitors C1 and C2 may be coupled in parallel to resistors R1 and R2, as shown in FIG. 5. In other embodiments, capacitors C1 and C2 may increase the stability of common-mode feedback module 310 by introducing zeros into the left half plane of a pole/zero plot associated with common-mode feedback module 310. Drain terminals of QP2 and QP3 may provide the input stage output signals and may be coupled to cascode stage 420.

In some embodiments, cascode stage 420 may include n-channel MOSFETs QN1, QN2, QN5, and QN6. In other embodiments, cascode stage 420 may include different numbers of devices (e.g., MOSFETS) and different types of devices (e.g., p-channel MOSFETS, n-type and p-type bipolar transistors, and the like). Cascode stage 420 may include two cascode pairs, each cascode pair including two n-channel MOSFETs. In one embodiment, cascode stage 420 may be configured as a low swing cascode module (e.g., a cascode module where the voltage perturbations on nodes within cascode stage 420 are small with respect to possible voltage swings based on module operating voltages).

A first cascode pair may include MOSFETS QN1 and QN5. A drain terminal of QN1 may be coupled to the drain terminal of QP2 (e.g., a first input stage output terminal from feedback input stage 415). A source terminal of QN1 may be coupled to a drain terminal of QN5. A gate terminal of QN5 may be coupled to the drain terminal of QN1. In some embodiments, QN1 may operate as an output load to QN5.

A second cascode pair may include MOSFETs QN2 and QN6. A drain terminal of QN2 may be coupled to the drain terminal of QP3 (e.g., a second input stage output terminal from feedback input stage 415). A source terminal of QN2 may be coupled to a drain terminal of QN6. A gate terminal of QN6 may be coupled to the drain terminal of QN2. In some embodiments, QN2 may operate as an output load for QN6. In one embodiment, a cascode stage output signal may be provided by the gate terminal of QN6.

In some embodiments, the first cascode pair and the second cascode pair may provide a "cascode load" for feedback input stage 415 (e.g., present transistors in a cascode arrangement as a load for QP2 and QP3). In some embodiments, the first cascode pair and the second cascode pair may increase input signal to output signal isolation and may increase a frequency response bandwidth of common-mode feedback module 310 by reducing a Miller effect associated with an output capacitance of one or more MOSFETs. In selected embodiments, QN1 and QN2 may be operated in a saturation mode in order to operate the first and the second cascode pairs. In some embodiments, a second bias voltage (VB2) may be provided to a gate terminal of QN1 and QN2 to bias these devices into operating in the saturation mode.

In some embodiments, additional (e.g., optional) resistors may be included within cascode stage 420 to modify a signal gain within common-mode feedback module 310. For example, a first terminal of R3 may be coupled to a source terminal of QN5 while a second terminal of R3 may be coupled to ground. Similarly, a first terminal of R4 may be coupled to a source terminal of QN6 while a second terminal of R4 may be coupled to ground. If resistors R3 and R4 are not included in cascode stage 420, then the source terminals of QN5 and QN6 may be coupled directly to ground.

The cascode stage output signal (provided by the gate terminal of QN6, described above) may be provided to an input of feedback output stage 430. In one embodiment, feedback output stage 430 may include four n-channel MOSFETs arranged in pairs to operate as a current mirror. In other embodiments, feedback output stage 430 may include different numbers of devices (e.g., MOSFETs) and/or other types of devices (e.g., p-channel MOSFETS, n-type and p-type bipolar transistors, and the like). In one embodiment, QN3 and QN7 may be arranged as a first current mirror and QN4 and QN8 may be arranged as a second current mirror. In some embodiments, QN3 and QN4 may be configured to operate in a saturation mode by bias voltage VB2 coupled to their respective gate terminals. Since QN7 and QN8 are similarly configured with respect to QN6, current within QN6 may be mirrored (e.g., replicated) by QN7 and QN8. In some embodiments, drain terminals of QN3 and QN4 may function as output terminals of feedback output stage 430 and thereby provide a feedback output signal 502.

In some embodiments, feedback output stage 430 may include one or more compensation capacitors that may be coupled to feedback output signal 502. For example, a first terminal of a capacitor C3 may be coupled to the drain terminal of QN3 and a first terminal of a capacitor C4 may be coupled to the drain terminal of QN4. A second terminal of capacitor C3 may be coupled to a second terminal of capacitor C4 at a node N2, which in turn may be coupled to the drain terminal of QN6. Compensation capacitors C3 and C4 may provide some frequency compensation to feedback output signal 502 and, therefore, to common-mode feedback module 310. For example, compensation capacitors C3 and C4 may extend a usable frequency response of common-mode feedback module 310.

In some embodiments, additional (e.g., optional) resistors may be included within feedback output stage 430 to reduce noise associated with common-mode feedback module 310. For example, a first terminal of R5 may be coupled to a source terminal of QN7 while a second terminal of R5 may be coupled to ground. Similarly, a first terminal of R6 may be coupled to a source terminal of QN8 while a second terminal of R6 may be coupled to ground. If resistors R5 and R6 are not included in feedback output stage 430, then the source terminals of QN7 and QN8 may be coupled directly to ground.

In some embodiments, feedback output signal 502 may be coupled to feedback input signal 501. Thus, currents from feedback output signal 502 may be added to and/or subtracted from currents from feedback input signal 501. In some embodiments, feedback output stage 430 may provide current buffer functionality for output signals 402. For example, buffered output current may be provided by MOSFETS operating as current mirrors.

In some embodiments, common-mode feedback module 310 may operate in a normal operating mode, as described above. For example, in the normal operating mode, QN1 and QN2 may operate in the saturation mode to allow the associated first and second cascode pairs to operate. Operation of QN1 and QN2 in the saturation mode may be determined a gate voltage, a threshold voltage and a drain-to-source voltage of the QN1 and QN2, respectively. In the saturation mode, a drain current of a MOSFET is independent of the drain-to-source voltage. Additionally, QN3 and QN4 may operate in the saturation mode to allow the first and the second current mirrors to replicate currents in feedback output stage 430. Operation of QN3 and QN4 in the saturation mode may be similar to operation of QN1 and QN2 as described above. In other embodiments, common-mode feedback module 310 may operate in a legacy mode. When operating in the legacy mode, common-mode feedback module 310 may operate with gain and bandwidth characteristics that may be different from the normal operating mode and may be associated with a different (e.g., legacy) design.

When operating in the legacy mode, one or more transistors within cascode stage 420 and feedback output stage 430 may operate in a linear mode instead of being operated in a saturation mode. For example, transistors QN1-QN4 may be operated in the linear mode to operate common-mode feedback module 310 in the legacy mode. Thus, QN1-QN4 may appear as resistive elements in cascode stage 420 and feedback output stage 430. In some embodiments, operation of QN1-QN4 in the linear mode and/or the saturation mode may be controlled by the bias voltage VB2. Thus, for such embodiments, a value of the bias voltage VB2 may operate to select between the normal mode of operation and the legacy mode of operation.

Figure 6:
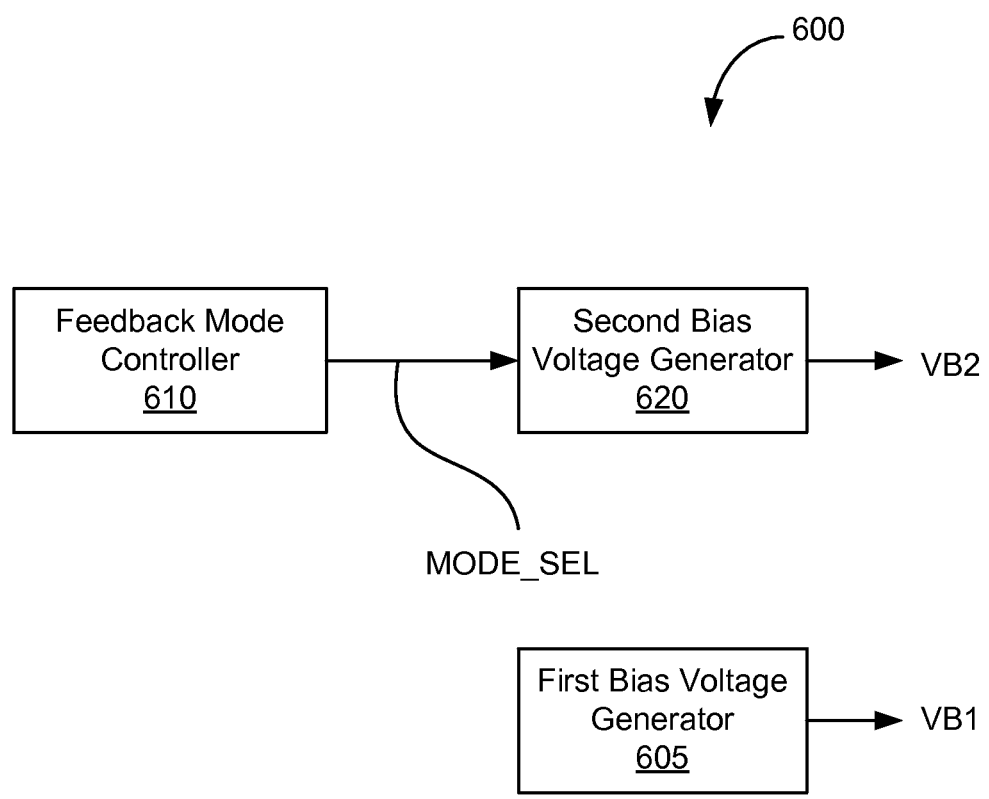
FIG. 6 shows a block diagram of an exemplary mode selection module.

FIG. 6 shows a block diagram of an exemplary mode selection module 600. Mode selection module 600 may include a first bias voltage generator 605, a feedback mode controller 610 and a second bias voltage generator 620. In some embodiments, first bias voltage generator 605 may generate bias voltage VB1 that, in turn, may be used to operate one or more devices as a current source. For example, bias voltage VB1 may be coupled to QP1 (see FIG. 5) to operate QP1 as a current source for QP2 and QP3. First bias voltage generator 605 may include transistors, resistors, capacitors, voltage references and any other technically feasible components to generate bias voltage VB1.

Feedback mode controller 610 may generate a MODE_SEL signal to cause the common-mode feedback controller 310 to operate in the normal operating mode or in the legacy mode, as described above. In some embodiments, feedback mode controller 610 may generate the MODE_SEL signal based on a desired gain and/or bandwidth characteristic of common-mode feedback module 30. Second bias voltage generator 620 may receive the MODE_SEL signal and, in response thereto, may generate bias voltage VB2 to operate one or more transistors in accordance with a desired mode of operation. Second bias voltage generator 620 may include transistors, resistors, capacitors, voltage references and any other technically feasible components to generate bias voltage VB2. A possible relationship between the normal operating mode, the legacy mode, and bias voltage VB2 is shown below in Table 1, where Vth is a threshold voltage associated with QN1-QN4.

TABLE 1

| Mode | QN1-QN4 operation | VB2 (voltage) |
| --- | --- | --- |
| Normal operating mode | Saturation | VB2 >> Vth |
| Legacy mode | Linear | VB2~Vth |

Figure 7:
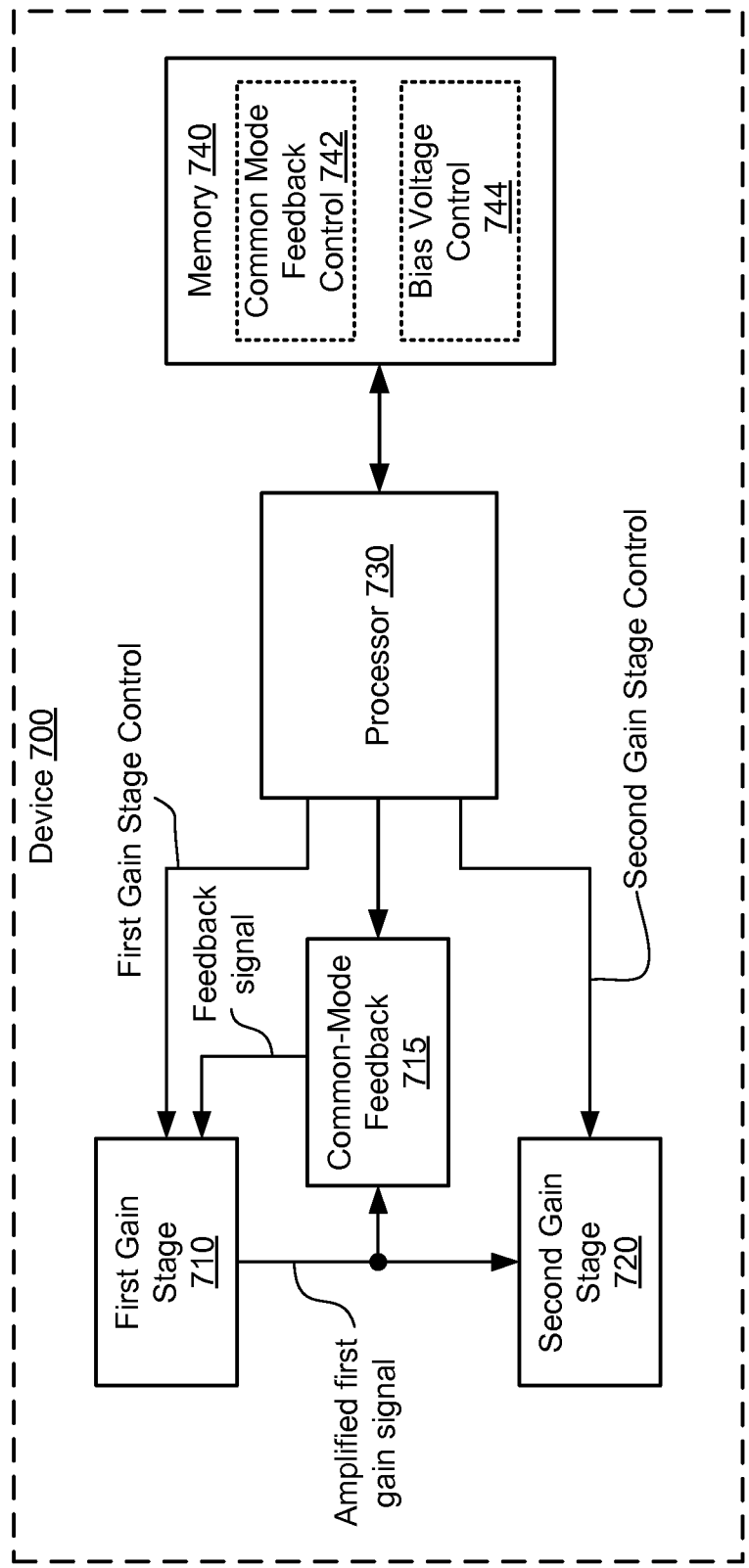
FIG. 7 shows a device that is another exemplary embodiment of the amplifier of FIG. 3.

FIG. 7 shows a device 700 that is another exemplary embodiment of the amplifier 300 of FIG. 3. Device 700 includes a first gain stage 710, a common-mode feedback module 715, a second gain stage 720, a processor 730, and a memory 740. Processor 730 may provide control signals (e.g., first gain stage control signals) to first gain stage 710 and control signals (e.g., second gain stage control signals) to second gain stage 720. As described above, first gain stage 710 may receive a first gain stage input signal, amplify the first gain stage input signal, and provide the amplified first gain stage input signal to the second gain stage 720. The amplified first gain stage signal may also be provided to common-mode feedback module 715. Common-mode feedback module 715 may provide a feedback signal to first gain stage 710.

Memory 740 may include a non-transitory computer-readable storage medium (e.g., one or more nonvolatile memory elements, such as EPROM, EEPROM, Flash memory, a hard drive, etc.) that may store the following software modules:
  a common-mode feedback control module 742 to select an operating mode of the common-mode feedback module 715; and
  a bias voltage control module 744 to control a bias voltage generator based on the selected operating mode.

Each software module includes program instructions that, when executed by processor 730, may cause the device 700 to perform the corresponding function(s). Thus, the non-transitory computer-readable storage medium of memory 740 may include instructions for performing all or a portion of the operations of FIG. 8.

Processor 730, which is coupled to first gain stage 710, common-mode feedback module 715, second gain stage 720, and memory 740, may be any suitable processor capable of executing scripts or instructions of one or more software programs stored in device 700 (e.g., within memory 740).

Processor 730 may execute common-mode feedback control module 742 operate common-mode feedback module 715 in a normal operating mode or a legacy mode. For example, common-mode feedback control module 742 may determine a desired operating mode of common-mode feedback module 715. In some embodiments, the normal operating mode may have a different gain and/or bandwidth characteristics compared to the legacy mode.

Processor 730 may execute the bias voltage control module 744 to determine a bias voltage for one or more devices (e.g., MOSFETs and/or bipolar transistors) included within common-mode feedback module 715. In one embodiment, the bias voltage may be based on the desired operating mode of the common-mode feedback module 715.

Figure 8:
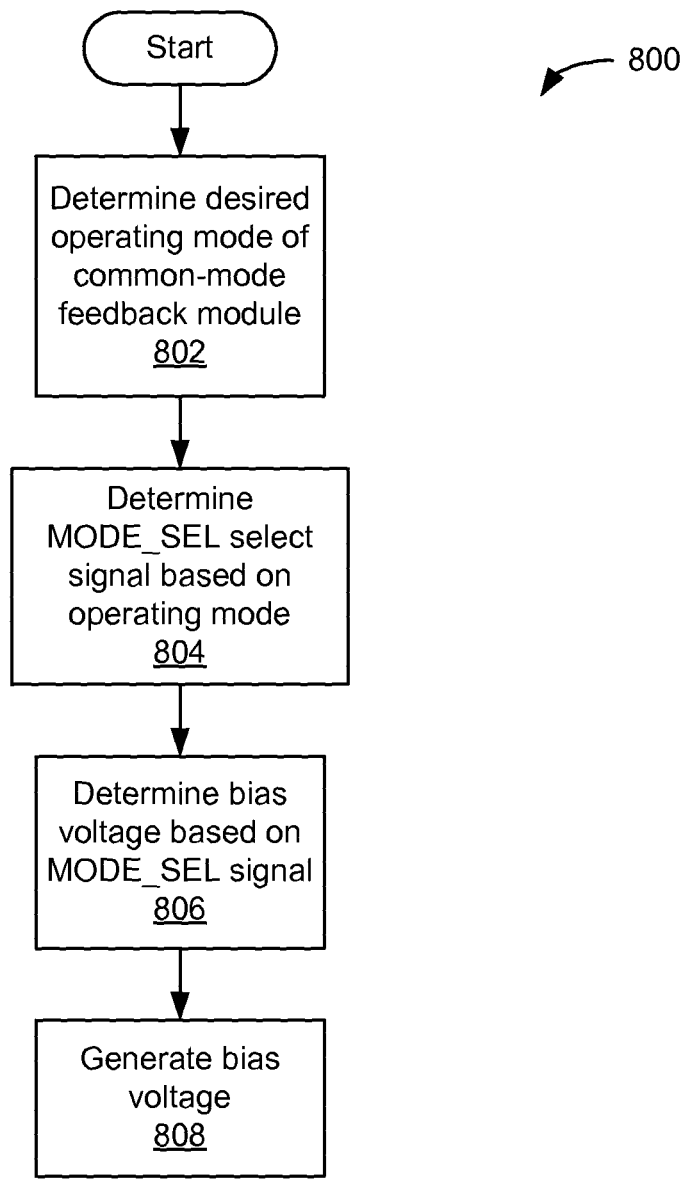
FIG. 8 shows an illustrative flow chart depicting an exemplary operation for operating the common-mode feedback module of FIG. 4.

FIG. 8 shows an illustrative flow chart depicting an exemplary operation 800 for operating common-mode feedback module 310 of FIG. 4. Referring also to FIGS. 1 and 2, an operating mode of the common-mode feedback module is determined (802). In some embodiments, the operating mode may be determined by a desired gain and/or bandwidth characteristic associated with common-mode feedback module 310. For example, a user may select the normal operating mode to operate common-mode feedback module 310 based on a desired gain and/or bandwidth characteristic.

Next, a MODE_SEL signal is determined based on the desired operating mode (804). In some embodiments, the MODE_SEL signal may be provided by feedback mode controller 610 (see also FIG. 6). Next, the bias voltage is determined based on the MODE_SEL signal (806). For example, if the MODE_SEL signal is in a first state to select the normal operating mode, then a bias voltage associated with operating common-mode feedback module 310 in the normal operating mode may be selected. On the other hand, if the MODE_SEL signal is in a second state to select the legacy mode, then a bias voltage associated with operating common-mode feedback module 310 in the legacy mode may be selected. In some embodiments, the bias voltage may be determined as described above in conjunction with Table 1.

Next, the determined bias voltage is generated (808). In some embodiments, the bias voltage may be generated by second bias voltage generator 620. In other embodiments, the bias voltage may be bias voltage VB2 and may be coupled to one or more MOSFETS.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In the foregoing specification, the present embodiments have been described with reference to specific exemplary embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A common-mode feedback module, comprising:
    a differential input stage configured to receive a first input signal and a second input signal, and to generate an input stage output signal based on the first input signal and the second input signal; and
    a cascode stage, comprising a cascode load coupled to the differential input stage, configured to generate a cascode stage output signal based on the input stage output signal, wherein the cascode load is configured to selectivity operate in at least one of a linear mode, or a saturation mode, or a combination thereof based on a bias voltage coupled to the cascode load.

2. The common-mode feedback module of claim 1, wherein the differential input stage comprises PMOS transistors to receive the first input signal and the second input signal.

3. The common-mode feedback module of claim 1, further comprising:
    a compensation capacitor coupled between an output of the common-mode feedback module and the cascode load.

4. The common-mode feedback module of claim 1, wherein an output signal of the common-mode feedback module is based on a current within the cascode load.

5. The common-mode feedback module of claim 1, wherein the cascode load further comprises a resistor, wherein a first terminal of the resistor is coupled to the cascode load and a second terminal of the resistor is coupled to ground.

6. The common-mode feedback module of claim 1, wherein the differential input stage further comprises:

a first capacitor configured to receive the first input signal; and a second capacitor configured to receive the second input signal.

7. The common-mode feedback module of claim 6, wherein the differential input stage further comprises:
a first resistor and a second resistor, wherein the first capacitor is coupled in parallel to the first resistor and the second capacitor is coupled in parallel to the second resistor.

8. The common-mode feedback module of claim 1, wherein the common-mode feedback module is included within a multi-stage amplifier.

9. The common-mode feedback module of claim 1, wherein the cascode load is configured to operate in at least one of the saturation mode, or the linear mode, or a combination thereof based on a mode select signal.

10. The common-mode feedback module of claim 9, further comprising a mode controller to generate the mode select signal.

11. The common-mode feedback module of claim 1, wherein the cascode load is configured to operate in at least one of a normal operating mode, or a legacy mode, or a combination thereof based on the bias voltage coupled to the cascode load, wherein the normal operating mode is the saturation mode, and the legacy mode is the linear mode.

12. The common-mode feedback module of claim 1, further comprising a bias voltage generator to generate the bias voltage based, at least in part, on a mode select signal.

13. A common-mode feedback module, comprising:
means for generating an input stage output signal based on a first input signal and a second input signal received at a differential input stage;
means for generating a cascode stage output signal based on the input stage output signal, via a cascode load coupled to the differential input stage; and
means for selectivity operating the cascode load in at least one of a linear mode, or a saturation mode, or a combination thereof based on a bias voltage coupled to the cascode load.

14. The common-mode feedback module of claim 13, wherein the means for generating the input stage output signal comprises:
means for receiving the first input signal and the second input signal via PMOS transistors.

15. The common-mode feedback module of claim 13, further comprising:
means for coupling a compensation capacitor between an output of the common-mode feedback module and the cascode load.

16. The common-mode feedback module of claim 13, further comprising:
means for coupling a resistor between the cascode load and ground.

17. The common-mode feedback module of claim 13, wherein the means for generating the input stage output signal further comprises:
means for receiving the first input signal through a first capacitor; and
means for receiving the second input signal through a second capacitor.

18. The common-mode feedback module of claim 17, further comprising:
means for coupling the first capacitor in parallel to a first resistor; and
means for coupling the second capacitor in parallel to a second resistor.

19. The common-mode feedback module of claim 13, wherein the means for generating the cascode stage output signal is based on operating the cascode load in at least one of a normal operating mode or a legacy operating mode, or a combination thereof, wherein the normal operating mode is the saturation mode, and the legacy operating mode is the linear mode.

20. A method for generating a feedback signal for an amplifier, the method comprising:
generating, at a differential input stage, an input stage output signal based on a first input signal and a second input signal;
generating, at a cascode stage, a cascode stage output signal based on the input stage output signal, the cascode stage comprising a cascode load coupled to the differential input stage; and
selectivity operating the cascode load in at least one of a linear mode, or a saturation mode, or a combination thereof based on a bias voltage coupled to the cascode load.

* * * * *